United States Patent [19]

Ogita et al.

[11] 4,365,349
[45] Dec. 21, 1982

[54] RADIO RECEIVER HAVING PHASE LOCKED LOOP AND AUTOMATIC FREQUENCY CONTROL LOOP FOR STABLY MAINTAINING LOCAL OSCILLATOR FREQUENCY OF VOLTAGE-CONTROLLED LOCAL OSCILLATOR

[75] Inventors: Minoru Ogita; Shigenobu Kimura, both of Hamamatsu, Japan

[73] Assignee: Nippon Gakki Seizo Kabushiki Kaisha, Shizuoka, Japan

[21] Appl. No.: 227,535

[22] Filed: Jan. 22, 1981

[30] Foreign Application Priority Data

| Feb. 1, 1980 [JP] | Japan | 55-11272[U] |
| Feb. 1, 1980 [JP] | Japan | 55-11273[U] |
| Jul. 24, 1980 [JP] | Japan | 55-101793 |

[51] Int. Cl.³ .................... H04B 1/10; H04B 1/16
[52] U.S. Cl. ............................ 455/192; 455/182; 455/194; 455/260; 455/212
[58] Field of Search ............... 455/164, 165, 182, 183, 455/194, 260, 266, 192, 212; 331/10

[56] References Cited

U.S. PATENT DOCUMENTS 4,078,212 3/1978 Rast .................................. 455/182
4,121,254 10/1978 Morita et al. ..................... 455/194
4,142,158 2/1979 Belisomi ........................... 455/183
4,264,977 4/1981 Deiss ................................ 455/182

*Primary Examiner*—Jin F. Ng
*Attorney, Agent, or Firm*—Frishauf, Holtz, Goodman & Woodward

[57] ABSTRACT

A radio receiver comprises a phase locked loop and an automatic frequency control loop which are selectively coupled with a voltage-controlled local oscillator to control a local oscillator frequency. The phase locked loop and the automatic frequency control loop have a common loop filter which supplies the voltage-controlled oscillator with a control voltage. The loop filter is arranged so that its time constant may be switched from a small value to a great value in response to switching of the operation mode of the voltage-controlled oscillator from a phase locked loop control mode for the selection of broadcasting station to an automatic frequency control loop control mode for the maintenance of the local oscillator frequency after tuning of the radio receiver. The radio receiver can be arranged so that the local oscillator frequency may be maintained by the phase locked loop after the tuning of the receiver to a weak broadcast signal when muting control is rendered ineffective by a muting switch.

5 Claims, 3 Drawing Figures

RADIO RECEIVER HAVING PHASE LOCKED LOOP AND AUTOMATIC FREQUENCY CONTROL LOOP FOR STABLY MAINTAINING LOCAL OSCILLATOR FREQUENCY OF VOLTAGE-CONTROLLED LOCAL OSCILLATOR

BACKGROUND OF THE INVENTION

This invention relates to a radio receiver, and more specifically, to a radio receiver having a receiving frequency setting mode for controlling the output frequency of a local oscillator by means of a phase locked loop (hereinafter referred to as PLL), and a tuning holding mode for maintaining the output frequency of the local oscillator under the control of an automatic frequency control (hereinafter referred to as AFC) loop.

Generally known are various radio receivers which have a receiving frequency setting mode for setting the output frequency of a voltage-controlled oscillator (hereinafter referred to as VCO) serving as a local oscillator to a desired frequency by means of a PLL which includes a phase comparator for comparing the phase of a signal corresponding to a local oscillator signal produced by the VCO with the phase of a reference signal with a given frequency, and a tuning holding mode for maintaining the output frequency of the VCO by means of an AFC loop which includes a tuning detector circuit to produce an S-curve signal representing the tuning condition of the receiver and negatively feeds back the S-curve signal to the VCO.

In a copending U.S. patent application Ser. No. 195,474 filed on Oct. 9, 1980 and assigned to the same assignee as this invention, there is disclosed a radio receiver in which the PLL and the AFC loop have a common loop filter for supplying the VCO with a control voltage. Such radio receiver is advantageous in cost since it requires only a single loop filter for two control loops.

Practically, however, the transfer function required of the loop filter varies with operation modes, that is, receiving frequency setting mode and tuning holding mode. When using the common loop filter, therefore, the efficiency of operation in one of those two modes need inevitably be sacrificed.

Namely, in the receiving frequency setting mode, it is desired that the time required for the actual setting of a receiving frequency after designation of the receiving frequency should be minimized. Accordingly, the time constant of the loop filter should be as small as possible. In the tuning holding mode, on the other hand, the stability of tuning is strongly desired, so that the time constant of the loop filter need be greater than the time constant used in the receiving frequency setting mode.

SUMMARY OF THE INVENTION

An object of this invention is to provide a radio receiver having a PLL and an AFC loop coupled selectively with a voltage-controlled local oscillator, the phase locked loop being specially adapted for the setting of a receiving frequency of the receiver, the AFC loop being adapted for the maintenance of a local oscillator frequency after tuning of the receiver to a broadcast signal, and these two loops having a common loop filter for supplying the voltage-controlled oscillator with a control voltage, and arranged such that the setting of a receiving frequency may be performed at high speed and that the tuning state of the receiver may be stably maintained after the tuning.

Another object of the invention is to provide a radio receiver having a PLL and an AFC loop coupled selectively with a voltage-controlled local oscillator, the PLL being specially adapted for the setting of a receiving frequency of the receiver, and the AFC loop being adapted for the maintenance of a local oscillator frequency after tuning of the receiver to a broadcast signal, and arranged such that the local oscillator frequency may be maintained by the PLL after the receiver is tuned to a weak broadcast signal when muting control is rendered ineffective by a muting switch.

DETAILED DESCRIPTION OF THE PREFERRED EMBODIMENTS

Figure 1:
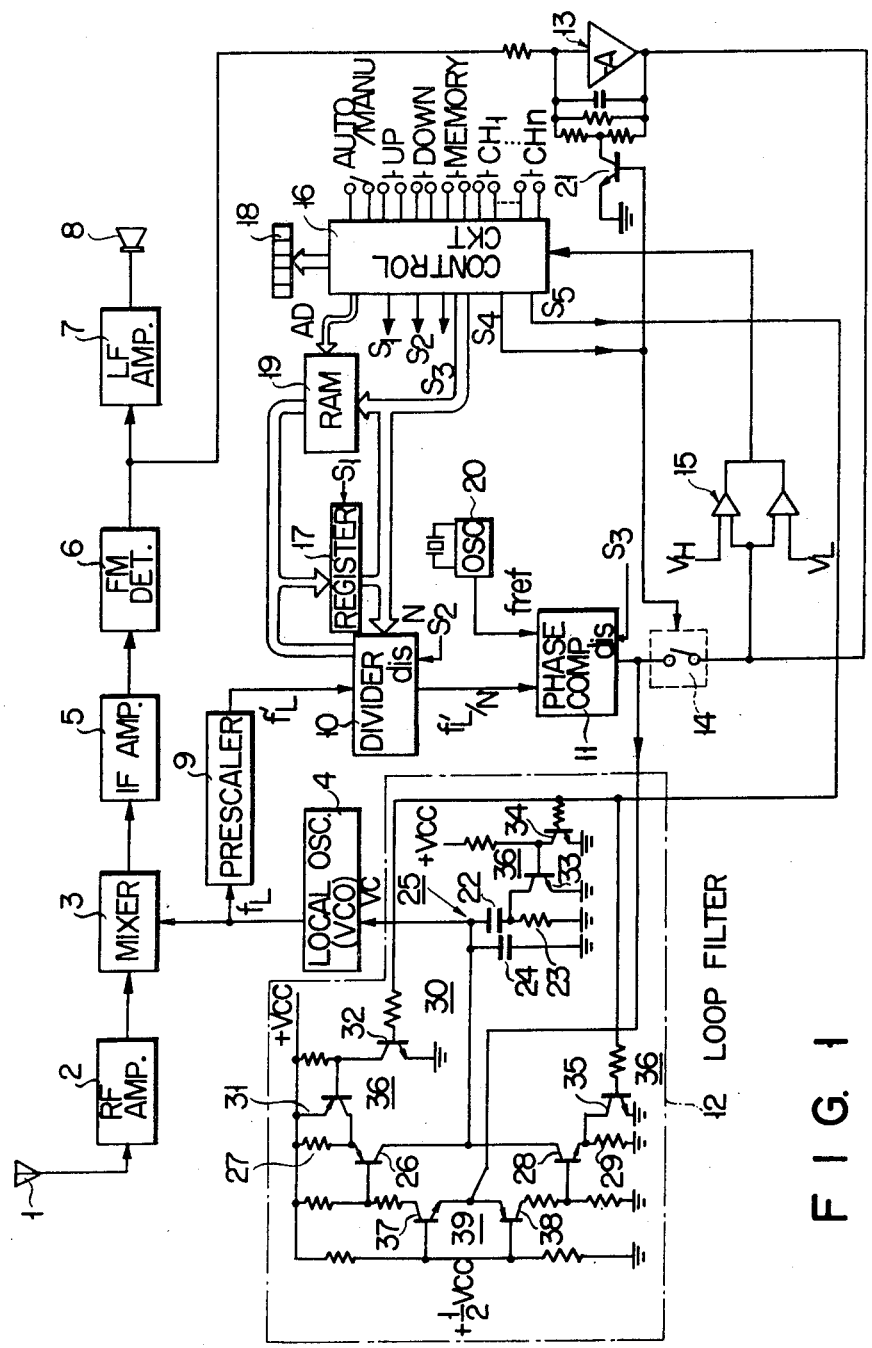
FIG. 1 is a block diagram of a radio receiver according to an embodiment of this invention.

Now there will be described a radio receiver, specifically an FM receiver, according to this invention. In FIG. 1, an FM broadcast signal received by an antenna 1 is amplified by a radio frequency (RF) amplifier stage 2, and then applied to a mixer 3 where it is mixed with a local oscillator signal produced by a local oscillator 4 composed of a voltage-controlled oscillator (VCO). Thus obtained is an intermediate-frequency (IF) FM signal centered at 10.7 MHz. This IF signal is transmitted through an IF amplifier stage 5 to an FM detector 6, where an audio information signal is recovered from the IF signal. The audio information signal is amplified by a low-frequency amplifier stage 7 and sounded by a loudspeaker 8.

The FM receiver is provided with two feedback loops for controlling the frequency $f_L$ of the local oscillator 4. The first feedback loop is a PLL which extends from a prescaler 9 for dividing the output frequency $f_L$ of the local oscillator 4 into $f_L'$ by a given factor to the local oscillator 4 through a variable frequency divider or programmable frequency divider 10, a phase comparator 11 and a loop filter 12. The second feedback loop is an AFC loop which extends from the mixer 3 to the local oscillator 4 through the IF amplifier stage 5, the FM demodulator 6, a tuning detector circuit 13, an analog switch 14 and the loop filter 12. Namely, the first and second feedback loops include a common loop filter.

The FM receiver has four operation modes; AUTOMATIC STATION SELECT mode, MANUAL STATION SELECT mode, PRESET STATION SELECT mode, and tuning hold mode or AFC mode. These operation modes are selectively executed by control signals S1 to S5 produced by a control circuit 16 which responds to a manual/automatic search mode selector switch AUTO/MANU, up scan switch UP, down scan switch DOWN, memory switch MEMORY, channel designation switches CH1 to CHn, and a window comparator 15.

Now there will be described in detail the functions of the main circuits constituting the first and second feedback loops. The programmable divider 10 is disabled when the output signal S2 of the control circuit 16 is high, and the signal S2 remains high while the AFC loop is operating. The dividing factor N of the programmable divider 10 is set by the output of a register 17 or the output of a counter (not shown) for frequency division control in the control circuit 16. The output of the counter is utilized to form data for driving a frequency indicator 18.

The register 17 operates so as to latch the count of the programmable divider 10 or channel designation data of a random access memory (RAM) 19. This latch operation is controlled by the output signal S1 of the control circuit 16. The RAM 19 has its address designated by an address designation signal AD from the control circuit 16, and stores the count of the counter in the control circuit 16.

The phase comparator 11 compares the phase of the output signal (frequency of $f_L'/N$) of the programmable divider 10 with the phase of a reference signal (frequency of $f_{ref}$) produced by a crystal-controlled oscillator 20, changing its output state in accordance with the relationship between the phases of these two signals. In this embodiment, the output of the phase comparator 11 assumes an open state (first state) if two input signals are in phase; zero volt (second state) if the signal ($f_L'/N$) leads the reference signal ($f_{ref}$) and $+V_{CC}$ volts (third state) if the signal ($f_L'/N$) lags behind the reference signal ($f_{ref}$). The phase comparator 11 is disabled when the control signal S3 is high. The control signal S3 remains high while the second feedback loop or AFC loop is operating.

The tuning detector circuit 13, which is connected to the FM detector 6 having an S-curve response, is composed of an active lowpass filter which produces an output signal $+\frac{1}{2} V_{CC} \pm G \times vi$. Here G and vi are the gain and input voltage of the detector circuit 13, respectively, and $V_{CC}$ is a constant voltage. The gain G and time constant $\tau$ of the detector circuit 13 are switched by the control signal S4. Namely, when the signal S4 goes high, a transistor 21 is turned ON to increase both the gain G and the time constant $\tau$ of the tuning detector circuit 13. When the signal S4 goes low, on the other hand, the transistor 21 is turned OFF to reduce both the gain G and the time constant $\tau$. The state of signal S4 depends on the output of the window comparator 15. Namely, when the radio receiver is tuned to a broadcast frequency to cause an output signal of the window comparator 15 to go high, the control signal S4 goes high. When the radio receiver is not tuned to the broadcast frequency, on the other hand, the signal S4 remains low.

Accordingly, the gain G and time constant $\tau$ of the tuning detector circuit 13 are small while the broadcast frequency band is being scanned in the AUTOMATIC STATION SELECT mode. Prevention of wrong selection of broadcasting station due to noise, and high-speed scanning can be achieved with use of the small gain and small time constant, respectively. After the receiver has once been tuned to the broadcast frequency, the gain G and time constant $\tau$ are both set great, thereby improving the stability of tuning.

The loop filter 12 is a lowpass filter which has an integral characteristic and comprises a capacitor circuit 25 including a series connection of an auxiliary capacitor 22 and a resistor 23, and a main capacitor 24 connected in parallel with this series connection, and an integration circuit 30 having a charging resistor 27 connected to the capacitor circuit 25 through a transistor 26, a discharging resistor 29 connected to the capacitor circuit 25 through a transistor 28. The loop filter 12 further comprises a time constant switching circuit 36 including transistor 31 to 35 for changing the time constant of the integration circuit 30, and a buffer circuit 39 including transistors 37 and 38 whose base potentials are both maintained at $+\frac{1}{2} V_{CC}$ and whose emitters are connected together, whereby the transistors 26 and 28 are controlled in accordance with the magnitude of an input signal voltage applied to the emitters of transistors 37 and 38.

The transistors 32, 34 and 35 of the time constant switching circuit 36 are controlled by the control signal S5 from the control circuit 16, and are turned ON when the signal S5 goes high. The control signal S5 remains high while the local oscillator 4 is being controlled by the first feedback loop or PLL.

In the receiver as described above, a desired one of the channel designation switches CH1 to CHn is operated for preset station selection. In consequence, a numerical value N corresponding to the selected channel is read out of the RAM 19 by an address signal AD corresponding to the selected channel. At the same time, the signal S1 goes high to cause the register 17 to latch the numerical value N. Thus, the dividing factor of the programmable frequency divider 10 is set to N. Since the PRESET mode is established, the control signals S2 and S3 are both low, so that the programmable divider 10 and the phase comparator 11 are enabled. Further, the control signal S4 is low, so that the analog switch 14 is OFF. Accordingly, the local oscillator 4 operates under the control of PLL. Since the control signal S4 is low, the gain G and time constant $\tau$ of the tuning detector circuit 13 are both set small. Since the control signal S5 is high during the operation of PLL, the transistors 31, 32 and 35 of the loop filter 12 are turned ON, whereas the transistor 33 is turned off. Accordingly, the charging resistor 27 and the discharging resistor 29 are short-circuited respectively by the transistors 31 and 35, and the auxiliary capacitor 22 is connected in series with the resistor 23. As a result, the time constant of the integration circuit 30 is rendered small.

When the receiver is not tuned to the selected broadcast signal, the output voltage of the phase comparator 11 is zero of $+V_{CC}$ volts. Accordingly, one of the transistors 37 and 38 forming the buffer circuit 39 is turned ON to cause the capacitor circuit 25 to be charged or discharged at a relatively high speed. The output voltage $V_C$ of the capacitor circuit 25 varies at a relatively high speed, thereby causing the output frequency of the local oscillator 4 to quickly approach the desired value. Namely, a high-speed preset station selection is performed. When the receiver is turned to the desired broadcast frequency within acceptable limits, the output signal of the window comparator 15 goes high, causing the control signals S2, S3 and S4 to go high and the control signal S5 to go low. Thus, the programmable divider 10 and the phase comparator 11 are disabled, and the analog switch 14 is turned ON. As a result, the output frequency of the local oscillator 4 is maintained by the AFC loop. At this time, the gain G and time constant $\tau$ of the tuning detector circuit 13 are set great and the transistor 33 in the loop filter 12 is turned ON, so that the auxiliary capacitor 22 is connected directly in parallel with the main capacitor 24. Moreover, since the transistors 31 and 35 are turned OFF, the charging resistor 27 and the discharging resistor 29 are inserted in the charging/discharging path of the capacitor circuit 25 to increase the time constant of the loop filter 12.

After the control mode of the local oscillator 4 is switched from the PLL mode to the AFC mode, therefore, even if the receiving frequency of the receiver varies by a relatively large margin, the change of the output voltage of the tuning detector circuit 13 is so small and slow that the output of the window comparator 15 remains high, since the gain G and time constant $\tau$ of the tuning detector circuit 13 are small. Also, the change of the output voltage $V_C$ of the loop filter 12 is so small and slow that the output frequency of the local oscillator 4 may be stably maintained.

When the up scan switch UP, for example, is instantaneously depressed after the AUTOMATIC STATION SELECT mode is selected by the automatic/manual search mode selector switch AUTO/MANU, the counter for frequency division control in the control circuit 16 is forwardly advanced at a given high speed. In consequence, the dividing factor of the programmable divider 10 is advanced in increments of one, as in the order of N, N+1, N+2 .... Accordingly, the output state of the phase comparator 11 alternates between $+V_{CC}$ volts and "open", thereby causing the transistor 37 of the loop filter 12 to be repeatedly turned ON and OFF. Since the time constant of the loop filter 12 is small, the output voltage $V_C$ steps up in close pursuit of the condution of the transistor 37, thereby quickly stepping up the output frequency of the local oscillator 4. When the receiver comes to be tuned to a certain broadcast signal by such operation, the control mode of the local oscillator 4 is switched from the PLL mode to the AFC mode as in the case of the above-mentioned PRESET SELECT mode, and the frequency of the local oscillator 4 is stably maintained under the control of the AFC loop.

Figure 2:
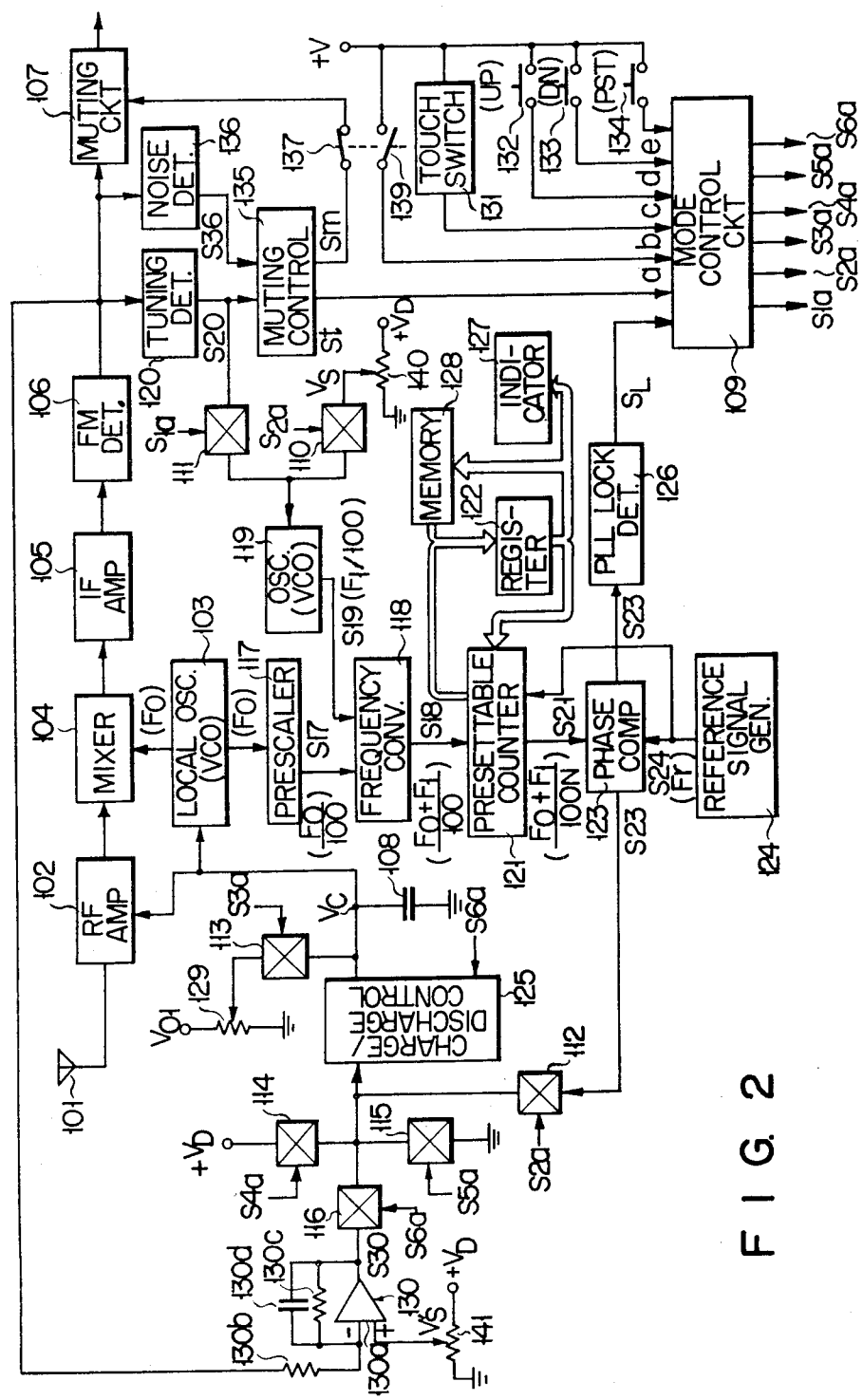
FIG. 2 is a block diagram of a radio receiver according to another embodiment of the invention.

Referring now to FIG. 2, there will be described an FM radio receiver or tuner according to a second embodiment of this invention. An FM broadcast signal received by an antenna 101 is amplified by a radio frequency (RF) amplifier stage 102 and then applied to a mixer stage 104 where it is mixed with a local oscillator signal from a local oscillator 103 to be converted to an intermediate-frequency (IF) FM signal centered at 10.7 MHz. This IF signal is amplified by an IF amplifier stage 105 and then applied to an FM detector 106 where an audio component is recovered from the IF signal. The recovered audio component is delivered to an audio amplifier system (not shown) through a muting circuit 107.

The local oscillator 103 is formed of a voltage-controlled oscillator (VCO) whose output frequency $F_0$ is controlled by a control voltage $V_C$ (charged voltage on a capacitor 108). The tuned frequency (receiving signal frequency) of the RF amplifier stage 102 is also controlled by the control voltage $V_C$ together with the local oscillator frequency $F_0$.

In this embodiment, the FM tuner is designed for the lower local system in which a local oscillator frequency is 10.7 MHz lower than a receiving frequency. Thus, VCO 103 is arranged to oscillate over a frequency range of 65.3 MHz to 79.3 MHz corresponding to the FM broadcast frequency band 76.0 MHz to 90.0 MHz with a channel spacing of 100 KHz as in Japan. It should be noted, however, that, to meet the US FM broadcast standard which adopts the upper local system, the VCO 103 is arranged to oscillate over a frequency range of 98.7 MHz to 118.7 MHz for the allocated FM broadcast frequency band 88 MHz to 108 MHz with 100 channels spaced 200 KHz apart. In this embodiment, the tuner is designed such that the greater the magnitude of the control voltage $V_C$, the higher both the output frequency $F_0$ of VCO 103 and the tuned frequency of the RF amplifier stage 102 will be.

The receiver is arranged to operate in MANUAL STATION SELECT mode, AUTOMATIC STATION SELECT mode, PLL mode or AFC mode to vary or hold the control voltage $V_C$ on the capacitor 108. The operation mode in which the tuner is operative depends on the states of analog switches 110 to 116 which are selectively turned ON and OFF by outputs S1a to S6a of a mode control circuit 109 (detailed in FIG. 3). The mode selection will be made clear by the later description.

The local oscillator signal is also applied to a prescaler 117 where the local oscillator frequency $F_0$ is divided by a factor of 100 to produce an output signal S17 of a frequency of $F_0/100$ which is then applied to an input of a frequency conversion circuit 118. To the other input of the frequency conversion circuit 118 is applied an output signal S19 of an oscillator 119 which is also a voltage-controlled oscillator (VCO).

The VCO 119 is designed to have a self-running frequency of $F_1/100$ which is one hundredth of 10.7 MHz and is responsive to application thereto of an output signal S20 of a tuning detect circuit 120 when the analog switch 111 is turned ON to shift its output frequency up or down with respect to $F_1/100$. The tuning detect circuit 120 is coupled to the output of FM detector 106 having an S-shaped response centered at 10.7 MHz and may be simply formed of an RC lowpass filter. In this embodiment, the FM detector 106 is arranged to have a DC output reference voltage the magnitude of which is $+\frac{1}{2} V_D$ volts at an input frequency of 10.7 MHz. Therefore, the magnitude of the output signal S20 of the tuning detect circuit 120 increases or decreases with respect to $+\frac{1}{2} V_D$ when the tuner is not exactly tuned to a broadcast signal.

The aforementioned VCO 119 has its oscillator frequency controlled also by a voltage $V_S$ which is set by a potentiometer 140 when the analog switch 110 is ON. The potentiometer 140 has one end thereof connected to $+V_D$ and the other end grounded, and $V_S$ is normally $+\frac{1}{2} V_D$ volts.

The frequency conversion circuit 118 is arranged to produce the sum of the output frequency ($F_0/100$) of the prescaler 117 and the output frequency ($F_1/100$) of the VCO 119. In order to receive the US FM broadcast signals on the other hand, the frequency conversion circuit 118 is arranged to produce the difference between the output frequency of the prescaler 117 and the output frequency of the VCO 119. It will be evident that since the frequency ($F_0+F_1$) or ($F_0-F_1$) corresponds to a receiving signal frequency, the output signal S18 of the frequency conversion circuit 118 has a frequency which is one hundredth of the receiving signal frequency. The frequency conversion circuit 118 may be arranged as disclosed in FIG. 3 of a copending U.S. Patent application Ser. No. 165,091 filed July 1, 1980, entitled "RADIO RECEIVER HAVING PHASE LOCKED LOOP FREQUENCY SYNTHESIZER," and assigned to the same assignee as this application.

The output signal S18 of the frequency conversion circuit 118 is applied to a clock input terminal of a presettable counter 121. The presettable counter 121 is arranged to operate either as a variable frequency divider (programmable frequency divider) or as a frequency counter in response to a control signal applied thereto from a control circuit not shown. The presettable counter 121 operates as the variable frequency divider only in the PLL mode in which only the analog switches 110 and 112 are turned ON. In this mode, the presettable counter 121 has preset input terminals supplied with through a register 122 a preset value (dividing factor) N read out of a memory (RAM) 128 and thus operates as a frequency divider for frequency-dividing the output signal S18 of the frequency conversion circuit 118 by the factor of N, whereby frequency divided output signal S21 of $(F_0+F_1)/100$ N is applied to an input of a phase comparator 123. More specifically, the counter 121 is counted down from the preset value N by the signal S18 and produces one shot of pulse each time the count reaches zero.

In the PLL mode, the other input of the phase comparator 123 is supplied with a reference signal S24 from a reference signal generator 124 which may be comprised of a crystal-controlled oscillator and a frequency divider for frequency-dividing the output frequency of the crystal-controlled oscillator. In this embodiment, a reference output frequency Fr of the reference signal generator 124 is set to be 1 KHz.

The phase comparator 123 is arranged to effect a phase comparison between the reference signal S24 and the output signal S21 of the presettable counter 121, and provide at its output one of tri-state outputs, that is, "open" (high impedance), a logical level 1 (a given positive voltage $V_D$) and a logical level 0 (ground potential), as the result of the phase comparison. The output S23 of the comparator 123 is coupled to a charge-/discharge control circuit 125 for the capacitor 108 through the analog switch 112 and to a PLL lock detect circuit 126.

The charge/discharge control circuit 125 forms a loop filter as shown in FIG. 1 along with the capacitor 108 which corresponds to the main capacitor 24 of FIG. 1. The time constant of charge/discharge control circuit 125 may be controlled by control signal S6a. The operation of the circuit 125 in the PLL mode will now be briefly described. The charge/discharge control circuit 125 is operative to cause the capacitor 108 to be charged when the output S23 is high ($V_D$) and to be discharged when it is low (ground). When the output S23 is open the charge or discharge of the capacitor 108 is prohibited so that a voltage across the capacitor 108 is held. Accordingly, the above-mentioned control voltage $V_C$ across the capacitor 108 is varied or held in accordance with the output state of the phase comparator 123 to determine the local oscillator frequency $F_0$.

Namely, the system comprised of the local oscillator 103, the prescaler 117, the oscillator 119, the frequency conversion circuit 118, the presettable counter 121, the reference signal generator 124, the phase comparator 123, the charge/discharge control circuit 125 and the capacitor 108 form PLL. The local oscillator frequency $F_0$ is controlled by the control voltage $V_C$ and the PLL is locked in such a condition as given by $$F_0+F_1=N\times 10^5 \text{ (Hz)}$$

As will be evident from the above equation, the preset value (dividing factor) N of the presettable counter 121 in the locked state of PLL, exactly corresponds to a number in three figures of 100 KHz and above of the receiving signal frequency $F_0+F_1$. The number N is also coupled to a frequency indicator 127 so that the receiving signal frequency is visually indicated. Incidentally, when the PLL is locked an output signal SL of the PLL lock detect circuit 126 goes high (logical level 1).

The above description is based on the assumption that the oscillator frequency of the oscillator 119 is $F_1/100$. In this state, the receiver can exactly be tuned to one of broadcast signals of frequencies spaced 100 KHz apart, such as 80.0 MHz, 82.5 MHz, etc. However, when the voltage $V_S$ is changed a little by the adjustment of the potentiometer 140, the oscillator frequency of the oscillator 119 is deviated a little from $F_1/100$. If the changed oscillator frequency is expressed as $F_1/100\pm\Delta f$, the PLL will be stabilized in a state given by $$F_0+F_1\pm 100\times\Delta f=N\times 10^5 \text{ (Hz)}.$$

Namely, if the frequency of the oscillator 119 is changed by $\pm\Delta f$ with respect to $F_1/100$, the receiving signal frequency varies by $\pm 100\times\Delta f$ from a reference receiving frequency which depends on the dividing factor N. The changed receiving frequency is stably maintained by PLL control. Accordingly, fine tuning adjustment can be achieved by adjusting the potentiometer 140. This enables the receiver to receive the broadcast signal in a better condition at a tuning point shifted from a complete tuning point which is automatically set by the PLL if the broadcast signal is subject to interference.

In the operation modes other than the PLL mode, the presettable counter 121 operates as a frequency counter. The operation of the counter 121 in the frequency counter mode will be described hereinafter. In this case, the analog switch 112 is turned OFF so that the PLL does not operate and the receiver is set to one of MANUAL STATION SELECT mode, AUTOMATIC STATION SELECT mode and AFC mode. In the MANUAL STATION SELECT mode, the analog switch 113 is turned ON so that the charge or discharge of the capacitor 108 is directly controlled by a potentiometer 129 connected across a source of voltage $V_{01}$. In the AUTOMATIC STATION SELECT mode, the analog switch 114 or 115 is turned ON so that the charge or discharge of the capacitor 108 is controlled through the charge/discharge control circuit 125. In the AFC mode, the analog switch 116 is turned ON so that an AFC tuning detect circuit 130 coupled to the output of the FM detector 106 controls the capacitor 108 through the charge/discharge control circuit 125. The local oscillator frequency $F_0$ is determined by the control voltage $V_C$ which is set in one of these modes.

In the operation mode in which the presettable counter 121 operates as the frequency counter, the counter 121 is supplied with the reference signal S24 of 1 KHz from the reference signal generator 124 as a timing clock signal to count the number of the output signal S18 of the frequency conversion circuit 118 during one cycle period of the reference signal S24. Accordingly, the count N' in the counter 121 is given by $$N' = \frac{F_0+F_1}{100} \times \frac{1}{1000} = (F_0+F_1)\times 10^{-5}.$$

As evident from the above equation, the count N' coincides with a number in three figures of 100 KHz and above of receiving signal frequency $(F_0+F_1)$. The count N' of the counter 121 is stored in the register 122 and then applied to the frequency indicator 127 so that the present receiving signal frequency of the receiver is visually indicated. In this mode, the analog switch 111 is turned ON so that the output frequency $F_1/100$ of the VCO 119 is variably controlled by the output signal S20 of the tuning detect circuit 120. This will be described in detail later.

The above-mentioned potentiometer 129 adapted for manual tuning is ganged with a tuning knob (not shown) and has one end of its resistance body coupled to the positive voltage $V_{01}$ and the other end thereof coupled to ground. The slider terminal of the potentiometer 129 is coupled to the capacitor 108 through the analog switch 113. There is provided a touch switch 131 associated with the tuning knob the output of which goes high when a user touches the tuning knob. As is described later, when the output of touch switch 131 goes high the analog switch 113 is turned ON so that the receiver is set to the MANUAL STATION SELECT mode. In this mode, the control voltage $V_C$ on the capacitor 8, that is, the receiving signal frequency can be freely varied by operating the tuning knob.

As is described later, the AUTOMATIC STATION SELECT mode comes into effect when an UP switch 132 or a DOWN switch 133 is actuated. The charge/-discharge control of the capacitor 108 in this mode will now be described. During a period of time from the actuation of UP switch 132 to tuning detection as described later, the analog switch 114 is turned ON so that the voltage $V_D$ is applied to the input of charge/discharge control circuit 125, gradually charging the capacitor 108. As a result, the magnitude of the control voltage $V_C$ increases to thereby raise the local oscillator frequency $F_0$ and receiving signal frequency. Conversely, during a period of time from the actuation of DOWN switch 133 to the tuning detection, the analog switch 115 is turned ON so that the input of charge/discharge control circuit 125 is coupled to ground to thereby gradually discharge the capacitor 108. As a result, the local oscillator frequency $F_0$ and receiving signal frequency are lowered.

A preset switch 134 is adapted for the preset selection of broadcast stations. The switch 134 is actuated to select a desired broadcast station in the PLL mode wherein a dividing factor N stored in the memory 128 and corresponding to the desired broadcast station is loaded into the presettable counter 121.

The AFC tuning detect circuit 130 is provided for detection of the magnitude and polarity of a DC tuning error voltage, with respect to the reference voltage $+\frac{1}{2} V_D$, that appears at the output of FM detector 106 when the tuner is not exactly tuned to a broadcast frequency and represents how far the receiving signal frequency of the tuner is displaced from the broadcast frequency, and for amplification of the DC tuning error voltage to produce a tuning error signal S30 the magnitude of which varies relative to $+\frac{1}{2} V_D$. More specifically, the detect circuit 130 includes an operational amplifier 130a having its inverting input coupled to the output of FM detector 106 through an input resistor 130b (RA), its noninverting input coupled to a slider terminal of potentiometer 141 connected across a source of voltage $+V_D$, and its output coupled to the inverting input through a parallel combination of a feedback resistor 130c (RB) and a capacitor 130d. An output voltage $V_S'$ of potentiometer 141 is normally set to $+\frac{1}{2} V_D$. With this arrangement, it will be evident that when the DC voltage at the output of FM detector 106 is equal to $+\frac{1}{2} V_D$, that is, the receiver is exactly tuned to a broadcast frequency, the output signal S30 of the AFC tuning detect circuit 130 has a magnitude of $+\frac{1}{2} V_D$. On the other hand, when the tuner is not exactly tuned to a broadcast frequency the detect circuit 130 amplifies the DC tuning error voltage by an amplification factor $A(=RB/RA)$ so that the output signal S30 has a magnitude which is greater or smaller than the DC output voltage of the FM detector 106 which includes the tuning error voltage.

The output of the detect circuit 130 is coupled to the input of charge/discharge control circuit 125 during the AFC mode in which the analog switch 116 is turned ON. As will be evident from the subsequent description of the circuit of FIG. 3, the charge/discharge control circuit 125 is arranged for inhibiting the capacitor 108 from charging and discharging, when the input voltage thereto is equal to $+\frac{1}{2} V_D$, to thereby hold the control voltage $V_C$, and for charging the capacitor 108 when the input voltage is greater than $+\frac{1}{2} V_D$ and discharging the capacitor 108 when the input voltage is smaller than $+\frac{1}{2} V_D$.

Namely, in the AFC mode, the control voltage $V_C$ across the capacitor 108 is controlled by the output signal S30 of the AFC tuning detect circuit 130 until the optimum tuning of the tuner to a broadcast frequency is established, or output signal S30 comes to have a magnitude of $+\frac{1}{2} V_D$.

The output voltage $V_S'$ of the aforementioned potentiometer 141 is $+\frac{1}{2} V_D$ when its slider is in the reference position. If the AFC mode, therefore, the receiving frequency of the receiver can be slightly shifted by adjusting the potentiometer 141 in the same manner as the case where the potentiometer 140 is adjusted in the PLL mode. Actually, the potentiometers 140 and 141 are ganged together, so that the receiving frequency can be shifted to the same degree in the PLL and AFC modes.

Next, a muting control circuit 135 will be described. The muting control circuit 135 is arranged to produce a muting control signal Sm and a tuning detect signal St in response to the output signal S20 of the tuning detect circuit 120 and an output signal S36 of a noise detect circuit 136. This noise detect circuit 136 may be comprised of a highpass filter coupled to the output of FM detector 106 to allow high frequency noises of 100 KHz and above to pass therethrough, a rectifier circuit for rectifying the high frequency noises, a smoothing circuit for smoothing the rectified high frequency noises and an amplifier for amplifying an output signal of the smoothing circuit. More specifically, the muting control circuit 135 may be comprised of a window comparator which compares the magnitude of the output signal S20 of the tuning detect circuit 120 with given comparison levels $(V_D/2)\pm\alpha$ defining an allowable tuning range of the tuner, a NAND gate having two inputs respectively coupled to the output of the window comparator and the output of noise detect circuit 136 for producing the muting control signal Sm, and a differentiator having an input coupled to the output of the NAND gate for producing the tuning detect signal St. Accordingly, when the magnitude of the output signal S20 falls within the allowable tuning range and the magnitude of output signal S36 is below a given level the muting control signal Sm goes high. Namely, the signal Sm is high only when the tuner is tuned to a broadcast frequency in a good condition and otherwise low. On the other hand, due to the differentiator circuit the tuning detect signal St goes high during a very short length of time in response to the positive transition of the muting control signal Sm from low level to high level. The muting control signal Sm is coupled to the muting circuit 107 through a muting switch 137. The tuning detect signal St is applied to the mode control circuit 109.

The muting circuit 107 is enabled to pass an output signal of the FM detector 106 therethrough when the switch 137 is open or when the control signal Sm of high level is applied thereto with the switch 137 closed.

The muting signal 137 is provided with a contact 139 ganged therewith and having one end connected to a power source +V. The muting contact 139 is closed when the switch 137 is open, and vice versa. The other end of the contact 139 is connected to the mode control circuit 109.

Next, there will be described hereinafter the selective switching of the tuner operation modes with reference to FIG. 3 which shows a practical circuit arrangement of the mode control circuit 109.

First, assume that the muting switch 137 is closed and the tuner is exactly tuned to a certain broadcast frequency in the AFC mode. At this time, since any one of the touch switch 131, UP switch 132, DOWN switch 133 and preset switch 134 which are coupled at one end thereof to a voltage source (+V) is not operated and the switch 139 is opened, the outputs a, b, c, d, e of these control switches are all low. Further, since the correct tuning of tuner to the broadcast frequency is kept by the AFC control, the muting control signal Sm is high, while the tuning detect signal St and a PLL lock detect signal $S_L$ are both low.

Figure 3:
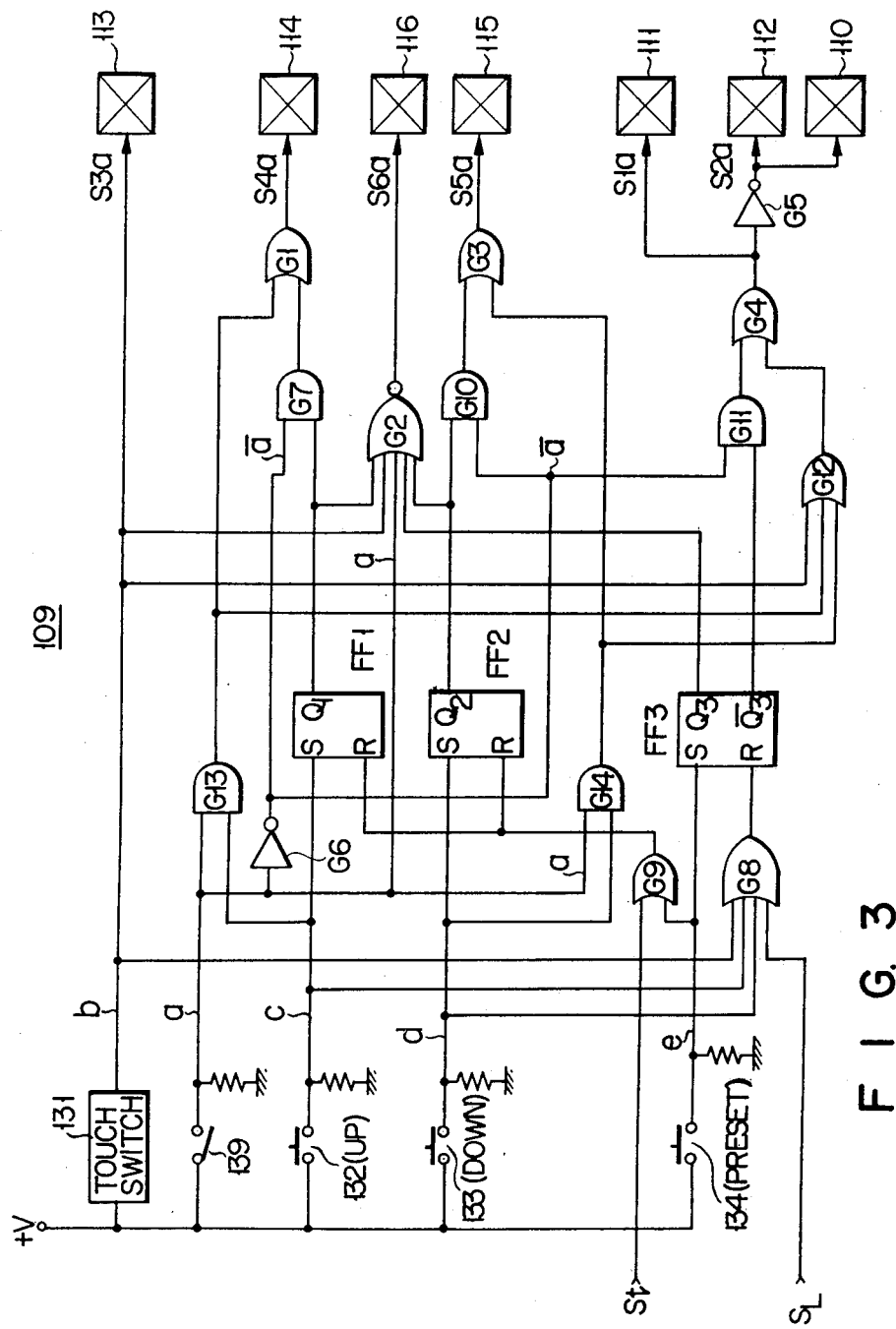
FIG. 3 shows in detail the mode control circuit of FIG. 2.

Further, in FIG. 3, flip-flop circuits FF1, FF2 and FF3 are all reset so that their set outputs Q1, Q2 and Q3 are low. As a result, the output signal b of the touch switch 131 or the control signal S3a is low, and the analog switch 113 is OFF. Also, the output signal S4a of an OR gate G1 is low, and the analog switch 114 is OFF. The output signal S6a of a NOR gate G2 is high, and the analog switch 116 is ON. The output signal S5a of an OR gate G3 is low, and the analog switch 115 is OFF. The output signal S1a of an OR gate G4 is high, and the analog switch 111 is ON. Moreover, the output signal S2a of an inverter G5 is low, and the analog switch 112 is OFF. Thus, the receiver operates in the AFC mode as mentioned before.

Now the AUTOMATIC STATION SELECT mode will be described. When the UP switch 132 is closed instantaneously in the aforesaid state, the signal c instantaneously goes high to set the flip-flop circuit FF1, thereby causing the output Q1 of circuit FF1 to go high. As a result, the output signal S6a of NOR gate G2 goes low to turn OFF the analog switch 116. At the same time, since an output signal $\bar{a}$ of an inverter G6 receiving the output signal a of the contact 139 is high, the output signal of an AND gate G7 and hence the output signal S4a of OR gate G1 go high to turn ON the analog switch 114. The output signal c of UP switch 132 is applied through an OR gate G8 to flip-flop circuit FF3 as its reset signal.

When the analog switch 116 is turned OFF, the control operation in the AFC mode terminates, and the analog switch 114 is turned ON instead. Thus, the AUTOMATIC STATION SELECT mode is established, and the control voltage $V_C$, as well as the receiving frequency, increases gradually. In consequence, the receiver is detuned to cause the muting control signal Sm to go low (muting circuit 107 is OFF). When the receiver is tuned to a subsequent broadcast signal, the muting control signal Sm goes high again (muting circuit 107 is ON), and the tuning detect signal St instantaneously goes high.

The high-level tuning detect signal St resets the flip-flop circuit FF1 (FF2) through an OR gate G9 to cause the output Q1 of circuit FF1 to go low. As a result, the output of AND gate G7 and hence the output signal S4a of OR gate G1 to go low to turn OFF the analog switch 114. At the samt time, the output signal S6a of NOR gate G2 goes high to turn ON the analog switch 116. Namely, the control operation in the AFC mode is reinitiated.

When the DOWN switch 133 is operated, the AUTOMATIC STATION SELECT mode is executed in the same manner as the aforementioned case. Namely, when the DOWN switch 133 is instantaneously closed to instantaneously render the signal d high, the flip-flop circuit FF2 is set. As a result, the output signal S6a of NOR gate G2 goes low to turn OFF the analog switch 116. At the same time, the output of an AND gate G10 and hence the output signal S5a of OR gate G3 go high to turn ON the analog switch 115. The output signal d of DOWN switch 133 is applied through the OR gate G8 to flip-flop circuit FF3 as its reset signal. Consequently, the control operation in the AFC mode terminates, and the control voltage $V_C$, as well as the receiving frequency, is lowered gradually. When the tuning state is detected to cause the signal St to go high, the flip-flop circuit FF2 is reset again, thereby turning OFF and ON the analog switches 115 and 116, respectively. Thus, the AFC mode is reinitiated.

The MANUAL STATION SELECT mode will now be described. When a user touches the tuning knob ganged with the potentiometer 129 during the AFC mode operation, the output b (S3a) of touch switch 131 goes high to turn ON the analog switch 113, and is applied through the OR gate G8 to flip-flop circuit FF3 as its reset signal. At the same time, the output signal S6a of NOR gate G2 goes low to turn OFF the analog switch 116. Thus, the control mode is switched from the AFC mode to the MANUAL STATION SELECT mode, and the receiving frequency may freely be shifted by operating the tuning knob as aforesaid.

When the user releases the tuning knob after selecting desired station by manual operation, the output b of touch switch 131 goes low to turn OFF the analog switch 113. Also, the output signal S6a of NOR gate G2 goes high to turn ON the analog switch 116. Namely, the control operation is returned to the AFC mode.

Now there will be described the preset station selection by means of the PLL. When the preset switch 134 is instantaneously closed to instantaneously render the signal e high, a numerical value N read out from a given address of the memory 128 by a control system (not shown) is preset as a dividing factor in the presettable counter 121 (then functioning as a variable frequency divider) through the register 122.

Further, the flip-flop circuit FF3 is set by the signal e (which also serves as the reset signal of FF1 and FF2 through the OR gate G9). When the flip-flop circuit FF3 is set, the output signal S6a of NOR gate G2 goes low to turn OFF the analog switch 116. At the same time, the output of an AND gate G11 goes low. Since the output of an OR gate G12 is also low at this time, the output signal S1a of OR gate G4 goes low to turn OFF the analog switch 111. Moreover, the output signal S2a of inverter G5 goes high to turn ON the analog switches 110 and 112.

With only the analog switches 110 and 112 ON, the receiver operates in the PLL mode. As mentioned before, a receiving frequency corresponding to the numerical value N read out from the memory 128 is set. When the PLL lock detect signal $S_L$ goes high, the flip-flop circuit FF3 is reset through the OR gate G8. As a result, the output of AND gate G11 and hence the output S1a of OR gate G4 go high to turn ON the analog switch 111. Also, the output S2a of inverter G5 goes low to turn OFF the analog switch 112, while the output S6a of NOR gate G2 goes high to turn ON the analog switch 116. Thus, the control operation is returned to the AFC mode.

As described above, when the muting switch 137 is closed, the muting control to turn ON and OFF the muting circuit 107 by means of the muting control signal Sm becomes effective, and the tuning state may automatically be maintained by AFC mode control after the aforementioned manual, automatic or preset station selection.

Now there will be described an operation with the muting switch 137 open. In this case, the muting circuit 107 is normally on, so that the muting control is ineffective. Since the muting contact 139 is closed, the operation of the mode control circuit 109 changes as follows.

When the attached contact 139 is closed, the aforementioned signals a and $\overline{a}$ go high and low, respectively. Accordingly, the output S6a of NOR gate G2 is fixed low, and the analog switch 116 is maintained OFF. Namely, in this case, the AFC mode control cannot be achieved.

Since the signal $\overline{a}$ is low, the output signals of AND gates G7, G10 and G11 are all fixed low, so that the filp-flop circuits FF1, FF2 and FF3 becomes ineffective for the control of the analog switches 111 to 116. As the signal a is high, moreover, the output of an AND gate G13 or G14 is rendered high during a period of time when the UP or DOWN switch 132 or 133 is closed. Thus, the analog switch 114 or 115 is turned ON through the OR gate G1 or G3.

Suppose that none of the touch switch 132, UP switch 132 and DOWN switch 133 is operated and the signals b, c and d are all low. In this case, the analog switches 113, 114, 116, 115 and 111 are OFF, while the analog switches 110 and 112 are ON. Namely, the operation is performed in the PLL mode where only the analog switches 110 and 112 are ON, and the receiving frequency is maintained at a value corresponding to the dividing factor N preset in the presettable counter 121.

In the above-mentioned state, when the tuning knob for manual station selection is touched, the analog switch 113 is turned ON. At the same time, the analog switch 111 is turned ON, while the analog switches 110 and 112 are turned OFF. Namely, the control operation in the PLL mode terminates, and the MANUAL STATION SELECT mode is established. In this MANUAL STATION SELECT mode, the receiving frequency can be freely changed by means of the tuning knob.

When the tuning knob is unhanded after the manual selection of broadcasting station, the output b (S3a) of the touch switch 131 goes low to turn OFF the analog switch 113. Further, the analog switches 111 and 112 are turned OFF and ON, respectively, and the control operation in the PLL mode is resumed. In this case, the operation in the PLL mode is performed in a state where a count value N' of the presettable counter 121 which has so far been operating as a frequency counter is stored in the register 122 and preset, as the dividing factor N, into the presettable counter 121 which is now to operate as a variable frequency divider. Namely, the receiving frequency obtained at a point of time when the tuning knob is unhanded is maintained by the PLL mode control.

When the muting switch 137 is open, the function of the tuning detect signal St to stop automatic station selection in the AUTOMATIC STATION SELECT mode is lost. Namely, when the UP switch 132 is closed, the output of AND gate G13 and hence the output S4a of OR gate G1 go high to turn the analog switch 114 ON as long as the UP switch 132 is closed. At the same time, the output signals of OR gates G12 and G4 go high to turn ON and OFF the analog switches 111 and 112, respectively. Thus, the PLL mode is terminated, and the control voltage $V_C$, as well as the receiving frequency, is increased gradually by the AUTOMATIC STATION SELECT mode control. The increase of the receiving frequency continues until the UP switch 132 is unhanded. Namely, when the UP switch 132 is opened, the analog switches 111 and 114 are turned OFF, while the analog switch 112 is turned ON. Thus, the receiving frequency ceases to increase, and is maintained as it is by the PLL mode control. When the DOWN switch 133 is closed, the same result is obtained, provided that the receiving frequency is gradually lowered.

When the preset switch 134 is closed, a given dividing factor N read out from the memory 128 by another control system (not shown) is preset in the presettable counter 121. Accordingly, the preset station selection is performed in the PLL mode where the analog switch 112 is ON, and the receiving frequency may be maintained by PLL even after the station selection (after PLL is locked).

Thus, where the muting switch 137 is operated to render the muting control ineffective, the operation mode is automatically switched to the PLL mode after the station selection, and the receiving frequency may be stably maintained by PLL. Namely, the receiver can exactly and stably be tuned even to a broadcast signal in such an awkward state of reception that the muting control signal Sm never goes high.

Although in the above embodiment the manual and automatic station selection can be achieved with the PLL released, it is easy to arrange the receiving so that the manual and automatic station selection may be achieved by changing the dividing factor N to be applied to the presettable counter 121 in the PLL mode.

Further, it is to be understood that the oscillator 119 is not essential to the arrangement for controlling the local oscillator frequency by means of PLL.

Furthermore, this invention can be applied also to an AM tuner. In this case, by comparison with the arrangement of FIG. 2, the FM detector 106 is replaced with an AM detector circuit, and the tuning detect circuits 120 and 130, noise detect circuit 136, and muting control circuit 135 are adapted for use with AM signals.

What we claim is:

1. In a radio receiver comprising a voltage-controlled oscillator which serves as a local oscillation to produce a local oscillator signal having a local oscillator frequency, said voltage-controlled oscillator being controlled by a phase locked loop in a first control mode when a broadcast signal is selected by said receiver and being controlled by an automatic frequency control loop in a second control mode to maintain the tuning of said receiver in said broadcast signal after said phase locked loop control, and means for switching over said first and second control modes, said phase locked loop and said automatic frequency control loop having a common loop filter coupled to said voltage-controlled oscillator to control the local oscillator frequency, said loop filter including means for changing transfer characteristics thereof in response to a switching operation of said switching means between the phase locked loop control mode and the automatic frequency control loop control mode.

2. A radio receiver according to claim 1, wherein said loop filter is arranged so as to have its time constant changed from a first value to a second value larger than said first value in response to the switching operation of said switching means to switch over the control mode from the phase locked loop control mode to the automatic frequency control loop control mode.

3. A radio receiver comprising:
receiving circuit means receiving a broadcast signal and recovering an audio information signal from said broadcast signal;
a voltage-controlled variable-frequency oscillator serving as a local oscillator to produce a local oscillator signal, for causing said receiving circuit means to be tuned to said broadcast signal;
tuning detecting means coupled with said receiving circuit means for detecting the tuning state of said receiving circuit means;
a phase locked loop adapted for connection to said voltage-controlled oscillator for controlling the frequency of said local oscillator signal;
an automatic frequency control loop adapted for connection to said voltage-controlled oscillator for controlling the frequency of said local oscillator signal;
control circuit means for selectively coupling said phase locked loop and said automatic frequency control loop to said voltage-controlled oscillator in response to said tuning detecting means, said control circuit means coupling said automatic frequency control loop to said voltage-controlled oscillator to maintain the frequency of said local oscillator signal under the control of said automatic frequency control loop when the tuning state is at a predetermined condition, and coupling said phase locked loop to said voltage-controlled oscillator to maintain the frequency of said local oscillator signal under the control of said phase locked loop when the tuning state is not at said predetermined condition;
a muting circuit connected with said receiving circuit means;
a muting circuit control means for controlling said muting circuit connected to said tuning detecting means, said muting circuit control means disabling said muting circuit when the tuning state is at said predetermined condition and enabling said muting circuit when the tuning state is not at said predetermined condition;
a muting switch which operates in such a manner that the control of said muting circuit control means is enabled when said muting switch is in a first state, and that the control of said muting circuit control means is disabled when said muting switch is in a second state; and
means responsive to said muting switch for causing said control circuit means to couple said phase locked loop to said voltage-controlled oscillator to maintain the frequency of said local oscillator signal under the control of said phase locked loop when said muting switch is in said second state.

4. A radio receiver according to claim 1 or 3, wherein said phase locked loop includes circuit means for shifting the frequency of said local oscillator signal which is stably maintained by said phase locked loop.

5. A radio receiver according to claim 1 or 3, wherein said automatic frequency control loop includes means for shifting the frequency of said local oscillator signal which is stably maintained by said automatic frequency control loop.

* * * * *